United States Patent
Chen et al.

(10) Patent No.: US 7,200,507 B2
(45) Date of Patent: Apr. 3, 2007

(54) METHOD AND DEVICE FOR CLOCK CALIBRATION

(75) Inventors: Yi-Chang Chen, Taipei (TW); Kuo-Yuan Yuan, Taipei (TW); Ying-Chien Liao, Taipei (TW); Shih-Jung Lai, Taipei (TW)

(73) Assignee: Fortune Semiconductor Corp., Taipei (TW)

( * ) Notice: Subject to any disclaimer, the term of this patent is extended or adjusted under 35 U.S.C. 154(b) by 187 days.

(21) Appl. No.: 11/000,964

(22) Filed: Dec. 2, 2004

(65) Prior Publication Data

US 2006/0122799 A1 Jun. 8, 2006

(51) Int. Cl.
*G06F 19/00* (2006.01)

(52) U.S. Cl. .......................... 702/89; 320/134

(58) Field of Classification Search ................ 702/89, 702/182–185, 188; 326/134
See application file for complete search history.

(56) References Cited

U.S. PATENT DOCUMENTS

| | | | | |
|---|---|---|---|---|
| 5,493,684 A * | 2/1996 | Gephardt et al. ............ | 713/322 |
| 5,514,946 A * | 5/1996 | Lin et al. ...................... | 702/63 |
| 5,541,489 A * | 7/1996 | Dunstan ...................... | 320/134 |
| 5,565,759 A * | 10/1996 | Dunstan ...................... | 320/135 |
| 5,572,110 A * | 11/1996 | Dunstan ...................... | 320/106 |
| 5,600,230 A * | 2/1997 | Dunstan ................. | 340/636.13 |
| 5,619,430 A * | 4/1997 | Nolan et al. .................. | 702/63 |
| 5,633,573 A * | 5/1997 | van Phuoc et al. .......... | 320/128 |
| 5,646,508 A * | 7/1997 | van Phuoc et al. .......... | 320/152 |
| 5,955,869 A * | 9/1999 | Rathmann .................... | 320/132 |
| 6,025,695 A * | 2/2000 | Friel et al. ................... | 320/106 |
| 6,025,698 A * | 2/2000 | Kim et al. ................... | 320/132 |
| 6,208,117 B1 * | 3/2001 | Hibi ........................... | 320/134 |
| 6,463,545 B1 * | 10/2002 | Fisher et al. ................ | 713/340 |
| 6,486,636 B1 * | 11/2002 | Stolitzka et al. ............ | 320/134 |
| 6,522,100 B2 * | 2/2003 | Hansford .................... | 320/106 |
| 6,661,204 B2 * | 12/2003 | Malcolm ..................... | 320/136 |
| 6,671,221 B2 * | 12/2003 | Beer et al. ................... | 365/233 |
| 6,856,922 B1 * | 2/2005 | Austin et al. .................. | 702/63 |
| 2001/0009361 A1 * | 7/2001 | Downs et al. ............... | 320/132 |
| 2003/0169020 A1 * | 9/2003 | Malcolm ..................... | 320/136 |
| 2006/0005055 A1 * | 1/2006 | Potega ........................ | 713/300 |
| 2006/0113960 A1 * | 6/2006 | Thulesius et al. ........... | 320/133 |

* cited by examiner

*Primary Examiner*—Edward Raymond

(57) ABSTRACT

A method and a device for calibrating an interior clock generator installed inside a power monitoring unit of a rechargeable battery. The device includes an input pin for inputting an external clock signal from an exterior clock generator installed outside the power monitoring unit. A calibration timer control circuit is connected to the input pin. A register is connected to the calibration timer control circuit for outputting a start signal to activate the calibration timer control circuit. A counter and a timer are controlled by the calibration timer control circuit to be activated simultaneously therewith to count the outside clock signal and an internal clock signal generated from the interior clock generator, respectively. Such that the timer stops counting when the counter stops counting, a first count of the timer is compared to a second count of the counter to calibrate the interior clock generator.

4 Claims, 3 Drawing Sheets

METHOD AND DEVICE FOR CLOCK CALIBRATION

BACKGROUND OF THE INVENTION

The present invention relates in general to a method and device for clock calibration, and more particularly, to a method and device utilizing the inputted external clock signal to calibrate the internal generated clock signals.

Nowadays a computer becomes a daily use in almost every house. The computer can help people to do a lot of things and is playing an important role in the modern life. Some people usually work outside, a laptop computer is more convenient. The laptop computer can utilize an adapter connected to a plug for receiving power. When users take the laptop computer outside, the laptop computer can use a rechargeable battery to provide power.

With reference to FIG. 1, conventional rechargeable battery with a plurality of cells connected in series contains a rechargeable circuit and a protecting and detecting circuit. The protecting and detecting circuit includes a protecting unit and a power monitoring unit. The power monitoring unit communicates with the laptop computer to measure voltage, current and temperature of the battery, and determines the residual electricity of the battery to let users know when the battery needed to be recharged.

The protecting unit timely detects the voltage and current of the battery. If only one cell with lower voltage is detected, the protecting unit will stop all cells supplying power. Then, all cells are charged until the cell with higher voltage finishes charging; however, it may happen that the cell with lower voltage is still not charged enough. In other words, it is possible that not all the cells are charged to have a predetermined amount of electrical energy.

The power monitoring unit measures the quantity of electricity by multiplying the current running for a specified time detected by the clock signal. Conventional method utilizes an interior clock generator installed in the power monitoring unit to generate the clock signal. However, this kind of clock generator can not provide precise clock signal so that the measured quantity of electricity may not be accurate. Another method utilizes an exterior clock generator to input more precise clock signal; however, the cost is higher.

BRIEF SUMMARY OF THE INVENTION

The present invention provides a method and a device for utilizing an accurate clock signal inputted outside from the power monitoring unit to calibrate an clock generator installed inside the power monitoring unit.

Accordingly, the method for calibrating an interior clock generator installed inside the power monitoring unit of a rechargeable battery includes providing an external clock signal from an exterior clock generator installed outside the power monitoring unit, setting a register to output a starting signal, activating a calibration timer control circuit by the starting signal, activating a counter to count the outside clock signal and a timer to count a internal clock signal generating from the interior clock generator simultaneously, stop counting the counter and the timer when a predetermined number of counting is achieved, and comparing a first count of the timer to the second count of the counter so as to calibrate the interior clock generator.

The objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These as well as other features of the present invention will become more apparent upon reference to the drawings therein.

DETAILED DESCRIPTION OF THE INVENTION

Figure 1:
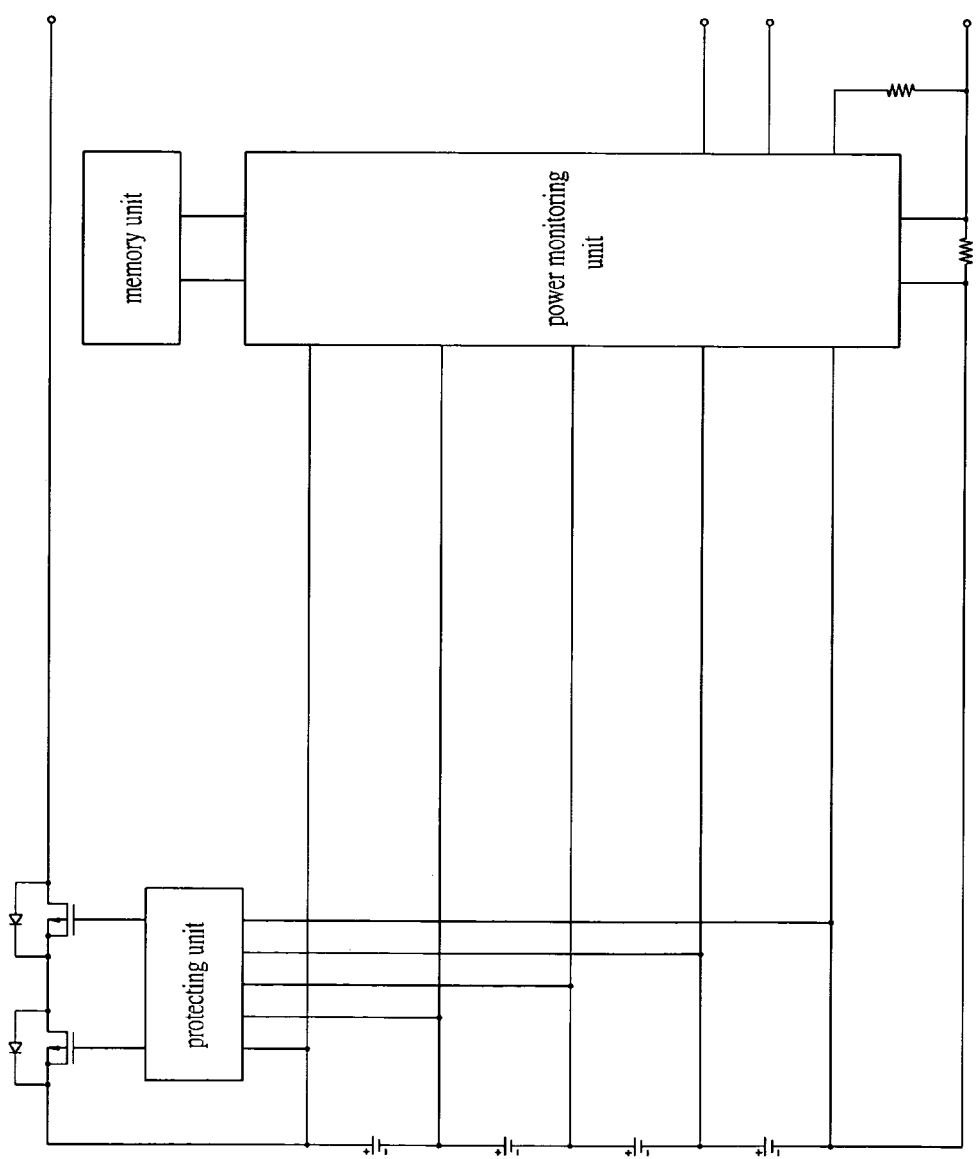
FIG. 1 is a circuit diagram of a conventional battery with a power monitoring unit for a laptop computer.

Reference will now be made in detail to the preferred embodiments of the present invention, examples of which are illustrated in the accompanying drawings. Wherever possible, the same reference numbers are used in the drawings and the description to refer to the same or like parts.

Figure 2:
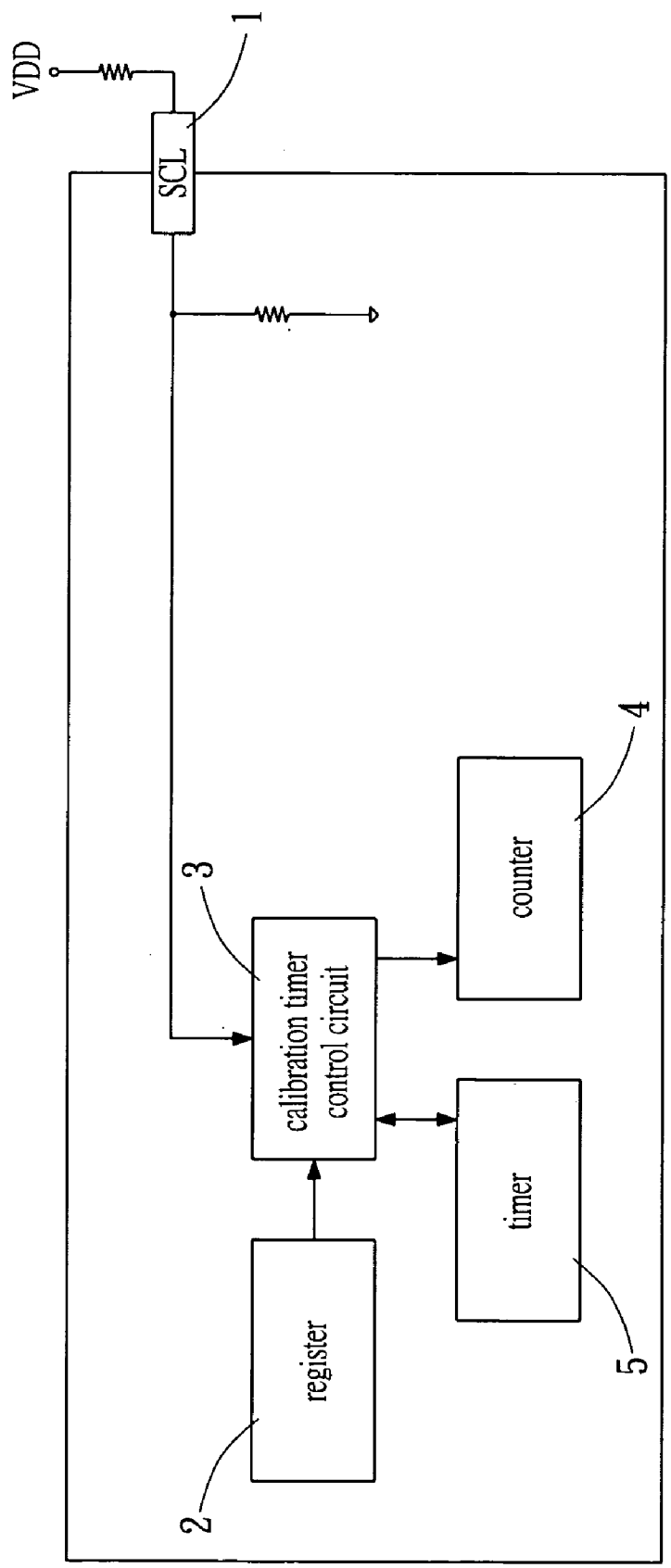
FIG. 2 is a block diagram of a power monitoring unit in accordance with the present invention.

Referring to FIG. 2, a power monitoring unit 1 of a rechargeable battery includes an input pin 1, a register 2, a calibration timer control circuit 3, a counter 4 and a timer 5. The present invention utilizes an accurate clock signal inputted outside from the power monitoring unit 1 to calibrate an oscillator installed inside the power monitoring unit.

In the preferred embodiment, the input pin 1 is an inputting terminal of the system management bus (SMBUS SCL) of the power monitoring unit 1 to input the outside clock signal.

The register 2 is used to generate a start signal for outputting.

The calibration timer control circuit 3 is connected to the input pin 1 and the register 2, and is activated to calibrate the timer 5 by the start signal from the register 2.

The counter 4 is connected to the calibration timer control circuit 3. When the calibration timer control circuit 3 is activated, the counter 4 starts simultaneously to count the inputting outside clock signal, and the timer 5 also starts simultaneously to count the interior clock signal from the oscillator installed inside the power monitoring unit 1.

The timer 5 is bi-directionally connected to the calibration timer control circuit 3. When the counter 4 stop counting according to the inputting outside clock signal, the timer 5 also stop counting at the same time via the control of the calibration timer control circuit 3. As such, the clock calibration is achieved by comparing the clock count of the counter 4 and timer 5.

Figure 3:
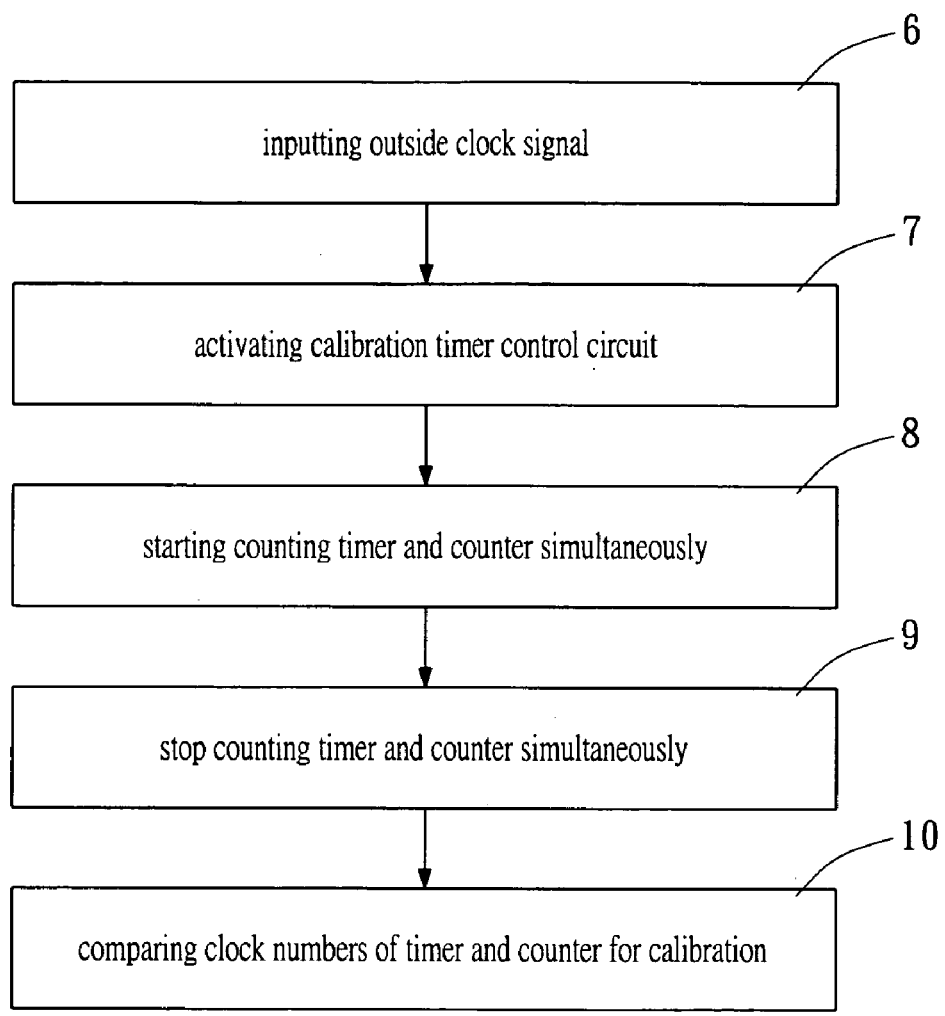
FIG. 3 is an operative flow chart for calibrating clock according to the present invention.

Referring to FIG. 3, the steps for clock calibration according to the present invention are as follows in step 6, an accurate clock signal is generated by the exterior clock generator and inputted to the power monitoring unit 1 through the input pin (SCL pin) 1.

In step 7, the register 2 has the bit thereof equal to one. The calibration timer control circuit 3 is activated to start clock calibration.

In step 8, when the calibration timer control circuit 3 is activated, the counter 4 and the timer 5 are activated at the same time. The counter 4 starts to accumulate the first clock count from the SCL pin 1. The timer 5 starts to accumulate the second clock count from the oscillator.

In step 9, the counter 4 stops counting when the first clock count is equal to a predetermined number. The timer 5 also stops counting at the same time by generating an interrupt signal (CALIF interrupt).

In step 10, the second clock count is compared with the first clock count to calibrate the oscillator. Such that, the voltage, current and temperature of the battery can be accurately measured.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A method for calibrating an interior clock generator installed inside a power monitoring unit of a rechargeable battery, the method comprising:
   providing an external clock signal from an exterior clock generator installed outside the power monitoring unit;
   setting a register to output a starting signal;
   activating a calibration timer control circuit by the starting signal;
   activating a counter to count the outside clock signal, and a timer to count a internal clock signal generating from the interior clock generator simultaneously;
   stop counting the counter and the timer when a predetermined number of counts is achieved; and
   comparing a first count of the timer to the second count of the counter so as to calibrate the interior clock generator.

2. The method in claim 1, wherein the first clock signal is inputted through an inputting terminal of the system management bus (SMBUS SOL) of the power monitoring unit.

3. The method in claim 1, wherein a bit of the register is set as one to output the starting signal.

4. A device for calibrating an interior clock generator installed inside a power monitoring unit of a rechargeable battery, the device comprising:
   an input pin of the power monitoring unit for inputting an external clock signal from an exterior clock generator installed outside the power monitoring unit;
   a calibration timer control circuit installed inside the power monitoring unit and connected to the input pin;
   a register installed inside the power monitoring unit and connected to the calibration timer control circuit, for outputting a start signal to activate the calibration timer control circuit;
   a counter installed inside the power monitoring unit and controlled by the calibration timer control circuit to be activated simultaneously therewith to count the outside clock signal; and
   a timer installed inside the power monitoring unit and controlled by the calibration timer control circuit to be activated simultaneously therewith to count an internal clock signal generated from the interior clock generator,
   whereby the timer stops counting when the counter stops counting, and a first count of the timer is compared to a second count of the counter to calibrate the interior clock generator.

* * * * *